(12) United States Patent
Mori et al.

(10) Patent No.: US 12,382,843 B2
(45) Date of Patent: Aug. 5, 2025

(54) DEVICE AND METHOD FOR FABRICATING HIGHLY INTEGRATED AND MINIATURIZED SILICON QUANTUM BIT DEVICE INCLUDING AT LEAST A TUNNEL FIELD EFFECT TRANSISTOR WITH REDUCED LEAKAGE CURRENT, INTER-QUANTUM BIT COUPLER, AND QUANTUM GATE OPERATING MECHANISM THAT ARE FORMED BY SELF-ALIGNMENT

(71) Applicant: NATIONAL INSTITUTE OF ADVANCED INDUSTRIAL SCIENCE AND TECHNOLOGY, Tokyo (JP)

(72) Inventors: Takahiro Mori, Ibaraki (JP); Atsushi Yagishita, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 371 days.

(21) Appl. No.: 17/924,037

(22) PCT Filed: Apr. 14, 2021

(86) PCT No.: PCT/JP2021/015416
§ 371 (c)(1),
(2) Date: Nov. 8, 2022

(87) PCT Pub. No.: WO2021/229987
PCT Pub. Date: Nov. 18, 2021

(65) Prior Publication Data
US 2023/0180633 A1 Jun. 8, 2023

(30) Foreign Application Priority Data
May 13, 2020 (JP) .................... 2020-084433

(51) Int. Cl.
*H10N 60/10* (2023.01)
*H10D 12/00* (2025.01)
(Continued)

(52) U.S. Cl.
CPC ......... *H10N 60/128* (2023.02); *H10D 12/211* (2025.01); *H10D 30/67* (2025.01);
(Continued)

(58) Field of Classification Search
CPC ...... H10N 60/128; H10N 60/01; H10N 60/11; A23B 2/733; H10D 30/603; H10D 30/402;
(Continued)

(56) References Cited

U.S. PATENT DOCUMENTS

2010/0295022 A1  11/2010  Chang et al.
2012/0217479 A1   8/2012  Chang et al.
(Continued)

FOREIGN PATENT DOCUMENTS

JP  H08-023086 A    1/1996
JP  2012-527776 A  11/2012
(Continued)

OTHER PUBLICATIONS

International Search Report issued in Application No. PCT/JP2021/015416, mailed Jul. 20, 2021.
(Continued)

*Primary Examiner* — Ermias T Woldegeorgis
(74) *Attorney, Agent, or Firm* — Michael Best & Friedrich LLP

(57) ABSTRACT

To suppress a leakage current caused by a gate of a tunnel field effect transistor included in a silicon spin quantum bit device, the silicon spin quantum bit device is provided including a tunnel field effect transistor having a gate, a source, and a drain, a quantum gate operation mechanism for
(Continued)

spin control, which is provided under the tunnel field effect transistor, and an inter-qubit coupler for coupling a channel of the tunnel field effect transistor with a channel of a tunnel field effect transistor included in another quantum bit device. Further, the gate is made wider in width than the channel and is partly formed on the inter-qubit coupler.

9 Claims, 13 Drawing Sheets

(51) Int. Cl.
    *H10D 30/67*     (2025.01)
    *H10D 48/00*     (2025.01)
    *H10D 64/27*     (2025.01)
    *H10N 60/01*     (2023.01)
    *H10D 62/10*     (2025.01)

(52) U.S. Cl.
    CPC ......... *H10D 48/3835* (2025.01); *H10D 64/27* (2025.01); *H10N 60/01* (2023.02); *H10N 60/11* (2023.02); *H10D 62/121* (2025.01)

(58) Field of Classification Search
    CPC ............. H10D 62/114; H10D 62/8161; H10D 84/201; H10D 30/67; H10D 48/3835; H10D 12/211; H10D 64/27; H10D 62/121
See application file for complete search history.

(56) References Cited

U.S. PATENT DOCUMENTS

2015/0060772 A1    3/2015   Miyata
2019/0266509 A1*  8/2019   Hutin .................. H01L 29/0653

FOREIGN PATENT DOCUMENTS

JP         2015-050196 A    3/2015
WO    WO-2020213596 A1 * 10/2020   ............. G06N 10/40

OTHER PUBLICATIONS

Keiji Ono et al., "High-temperature operation of a silicon qubit", Scientific Reports, Published Jan. 24, 2019, pp. 1-8, Article No. 469 (2019), DOI: 10.1038/s41598-018-36476-z, Nature.com.

Takahiro Mori et al., "Large scale integration of silicon qubits to realize quantum computer", Web page for Overview of Quantum information technology in MEXT, https://www.jst.go.jp/stpp/q-leap/en/pdf/quantuminformationtechnology.pdf, "[Basic Foundation Research] "Quantum information technology (Quantum computer, Quantum simulator)" ③", Jan. 2020, Japan Science and Technology Agency (JST).

* cited by examiner

DEVICE AND METHOD FOR FABRICATING HIGHLY INTEGRATED AND MINIATURIZED SILICON QUANTUM BIT DEVICE INCLUDING AT LEAST A TUNNEL FIELD EFFECT TRANSISTOR WITH REDUCED LEAKAGE CURRENT, INTER-QUANTUM BIT COUPLER, AND QUANTUM GATE OPERATING MECHANISM THAT ARE FORMED BY SELF-ALIGNMENT

TECHNICAL FIELD

The present invention relates to a silicon spin quantum bit device and a manufacturing method therefor.

BACKGROUND ART

A configuration example of a conventional silicon spin quantum bit device is shown in FIG. 1A. As shown on the left side of FIG. 1A, in this conventional configuration example, a two-dimensional lattice-like bit arrangement assuming error correction (surface code) implementation has been realized by connecting a plurality of tunnel field effect transistors (TFETs: Tunnel Field Effect Transistors) with an inter-qubit coupler. The degree of integration can be improved by periodically repeating a unit cell.

As shown on the right side of FIG. 1A, the unit cell includes a TFET source and drain (a readout mechanism), a TFET channel sandwiched between the source and drain, a TFET gate formed on the TFET channel via a gate insulating film, an inter-qubit coupler in contact with both side surfaces of the TFET channel, and a quantum gate operation mechanism provided below the TFET source and drain and the channel. Incidentally, the quantum gate operation mechanism, the TFET source and drain, and the TFET gate are provided with contacts.

However, a specific manufacturing method of such a silicon spin quantum bit device is not clear.

For example, it is required to form a quantum gate operation mechanism directly under a TFET channel made of single crystal Si, but when the quantum gate operation mechanism and the TFET channel are formed in this order, misalignment occurs as shown in FIG. 1B, thus causing variations in device characteristics. Also, miniaturization and high integration become difficult. Further, another problem arises in that when the quantum gate operation mechanism and the TFET channel are formed in this order, the TFET channel becomes polysilicon, and the life of the spin quantum bit becomes short.

Further, it is required to form the inter-qubit coupler on both side surfaces of the TFET channel, but as shown in FIG. 1C, when the TFET channel and the inter-qubit coupler are formed separately, misalignment occurs, thus resulting in variations in device characteristics. Also, miniaturization and high integration become difficult. Both of these may be made of the same material, but the inter-qubit coupler may use another material. Further, due to the convenience of TFET gate formation, simultaneous patterning formation is difficult.

Further, it is required to form the TFET gate in alignment with the positions of other components including the TFET channel, but as shown in FIG. 1D, when the TFET gate is formed last, misalignment occurs, thus causing variations in device characteristics. Also, miniaturization and high integration become difficult. It is also conceivable to change the formation order of the TFET gate, but it cannot be done before the formation of the TFET channel (a quantum well such as an IET (Iso-Electronic Trap)). Since there is a high temperature thermal process in the formation of the TFET source and drain, it is difficult to form the TFET source and drain after the formation of the TFET channel, so that it is also difficult to change the order of formation.

Also, when the TFET gate is misaligned or dimensionally misaligned, as shown in FIG. 1E, a leakage current may be generated between the TFET source and drain, or a leakage current may be generated in the inter-qubit coupler. This can adversely affect the operation of the adjacent qubit.

Further, a problem arises in that as shown in FIG. 1F, even in the ideal case where there is no misalignment and no dimensional misalignment of the TFET gate, i.e., even in the case where there is no spin coherence breakdown due to a leakage current or crosstalk, it is difficult to maintain the long-range spin coherence of the inter-qubit coupler. The reason why this problem occurs is that the state of an electron spin in the material of the inter-qubit coupler is disturbed due to defects in the material of the inter-qubit coupler and noise generated from contamination, etc., and hence its coherence cannot be maintained.

PRIOR ART DOCUMENTS

Non-Patent Documents

Non-Patent Document 1: Keiji Ono, Takahiro Mori & Satoshi Moriyama, "High-temperature operation of a silicon qubit", Nature Scientific Reports, 24, January 2019

Non-Patent Document 2: Takahiro Mori, "Large scale integration of silicon qubits to realize quantum computer", Web page for Overview of Quantum information technology in MEXT—Quantum Leap Flagship Program, Japan Science and technology Agency, January, 2020

DISCLOSURE OF THE INVENTION

Problems to be Solved by the Invention

It is therefore an object of the present invention to provide, as one aspect, a manufacturing method for suppressing variations in device characteristics in a silicon spin quantum bit device.

It is also another object of the present invention to provide, as one aspect, a device structure for suppressing a leakage current caused by a gate of a tunnel field effect transistor included in a silicon spin quantum bit device.

Means for Solving the Problems

There is provided, as a manufacturing method according to the present invention, a method for manufacturing a silicon spin quantum bit device having a tunnel field effect transistor, an inter-qubit coupler, and a quantum gate operation mechanism, including the steps of forming a dummy gate in a silicon film so as to cover a portion in which a channel region of the tunnel field effect transistor is formed and a portion in contact with the inter-qubit coupler, and forming in self-alignment at least either of the inter-qubit coupler and the quantum gate operation mechanism with respect to at least a part of the tunnel field effect transistor by using the dummy gate.

There is provided a silicon spin quantum bit device according to the present invention, which includes a tunnel field effect transistor having a gate, a source, and a drain, a quantum gate operation mechanism for spin control, which is provided under the tunnel field effect transistor, and an inter-qubit coupler for coupling a channel of the tunnel field effect transistor with a channel of a tunnel field effect transistor included in another quantum bit device. Further, the gate is made wider in width than the channel and partly formed on the inter-qubit coupler.

MODE FOR CARRYING OUT THE INVENTION

First Embodiment

A method for manufacturing a silicon spin quantum bit device according to a first embodiment will be described with reference to FIGS. 2A to 2O.

Figure 2A:
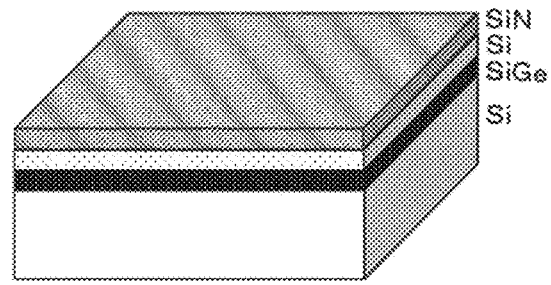
FIG. 2A is a diagram for describing a manufacturing method according to a first embodiment of the present invention.

First, as shown in FIG. 2A, for example, on a silicon wafer having a diameter of 300 mm, an SiGe film having a thickness of 30 nm (Ge concentration ~30%) and an Si film having a thickness of 40 nm are sequentially and epitaxially grown. An SiN film is deposited thereon to 30 nm as a hard mask by CVD (Chemical Vapor Deposition).

Figure 2B:
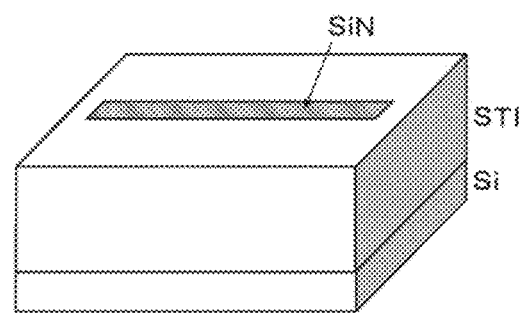
FIG. 2B is a diagram for describing the manufacturing method according to the first embodiment of the present invention.

Next, as shown in FIG. 2B, an element region and an element isolation (STI: Shallow Trench Isolation) region are formed. For example, a liquid immersion exposure device is used to form a pattern of an element region having a width of 50 nm and a length of 450 nm. The SiN film, the Si film, the SiGe film, and an Si substrate (up to a depth of 150 nm) in the element isolation region are etched by RIE (Reactive Ion Etching). HDP (High-Density Plasma)-$SiO_2$ having a thickness of about 300 nm is deposited as an STI insulating film and flattened by CMP (Chemical Mechanical Polishing).

Figure 2C:
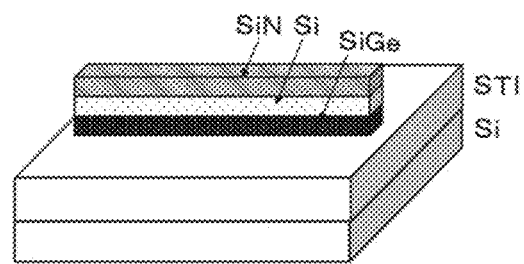
FIG. 2C is a diagram for describing the manufacturing method according to the first embodiment of the present invention.

Next, as shown in FIG. 2C, the STI insulating film is etched back (recessed) by RIE to expose the side surfaces of the SiN film, the Si film, and the SiGe film in the element region.

Figure 2D:
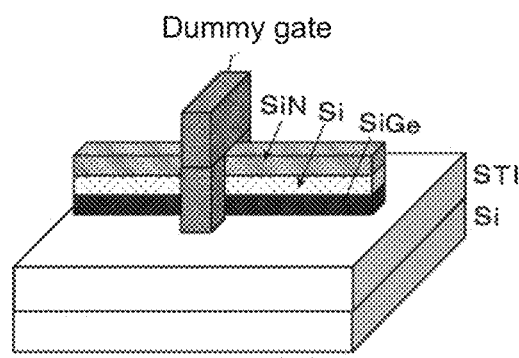
FIG. 2D is a diagram for describing the manufacturing method according to the first embodiment of the present invention.

Further, as shown in FIG. 2D, a dummy gate (whose gate length is about 50 nm) is formed via a thin gate oxide film of about 2 nm. For example, after thermal oxidation of 2 nm, polysilicon (Poly-Si) having a thickness of 200 nm is deposited by CVD, flattened by CMP, and patterned by immersion lithography and RIE. At this time, the polysilicon dummy gate is formed so as to straddle the element region (the region which is to be a channel later), so that the dummy gate comes into contact with the upper surface (SiN) and the side surface (Si and SiGe) of the element region.

In addition, source and drain diffusion layers are formed here. For example, in FIG. 2D, a p+ diffusion layer (source) is formed in the element region on the left side of the dummy gate, and in FIG. 2D, an n+ diffusion layer (drain) is formed in the element region on the right side of the dummy gate. Thus, the dummy gate causes the source and drain to be formed by self-aligning (also referred to as self-alignment) apart by the length of the dummy gate. P+ ion implantation conditions are, for example, Boron, Tilt angle=7 degrees, acceleration voltage=10 keV, and Dose amount=$2\times10^{15}$ $cm^{-2}$. Further, N+ ion implantation conditions are, for example, As, Tilt angle=7 degrees, acceleration voltage=40 keV, and Dose amount=$2\times10^{15}$ $cm^{-2}$, and spike annealing at 1000° C. is performed for activation.

Figure 2E:
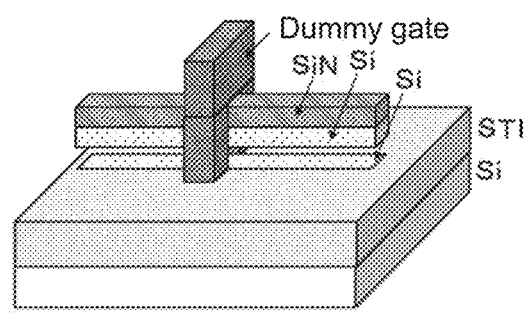
FIG. 2E is a diagram for describing the manufacturing method according to the first embodiment of the present invention.

Next, as shown in FIG. 2E, for example, the SiGe film under the Si film is selectively removed by using HCl gas to form a hollow structure. Here, the dummy gate supports the SiN film and the Si film in the element region so that they are sandwiched between the upper surface and both side surfaces thereof to prevent the device from collapsing. Incidentally, even in the manufacture of known Horizontally stacked nanowire FETs, SiGe is removed to form the hollow structure, where SiGe in a gate trench is removed, and the source and drain are supported by the surrounding insulating film material. This is different from the present embodiment.

Figure 2F:
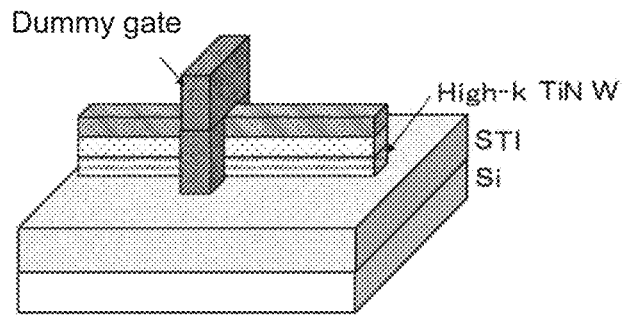
FIG. 2F is a diagram for describing the manufacturing method according to the first embodiment of the present invention.

After that, as shown in FIG. 2F, a High-k insulating film and a metal material as a quantum gate operation mechanism are embedded and formed directly under the Si film in the element region. For example, 5 nm $HfO_2$ is deposited by ALD (Atomic Layer Deposition), 5 nm-thick TiN and 10 nm W (tungsten) are sequentially deposited by CVD. They are left directly under the Si film in the element region by the entire surface etchback and some HF treatment. In this way, the quantum gate operation mechanism ($HfO_2$, TiN and W) is formed directly below the Si film by self-aligning. Incidentally, a laminated film of "$HfO_2$/TiN/W/TiN/$HfO_2$" is formed in a source/drain region below the Si film. Further, a concentric laminated film of "$HfO_2$ (outside)/TiN/W (core)/TiN/$HfO_2$ (outside)" is formed in a channel region (region under the dummy gate) below the Si film. Thus, $HfO_2$ is formed in close contact with the lower surface of the channel, the upper surface of the Si substrate, and the side surface of the dummy gate.

Thus, by forming the quantum gate operation mechanism directly under the Si film to be a channel later via a thin High-k insulating film, the channel and the quantum gate operation mechanism can be formed at a shorter distance compared to wafer bonding, etc., quantum gate operation efficiency can be improved, and crosstalk can be prevented.

Figure 2G:
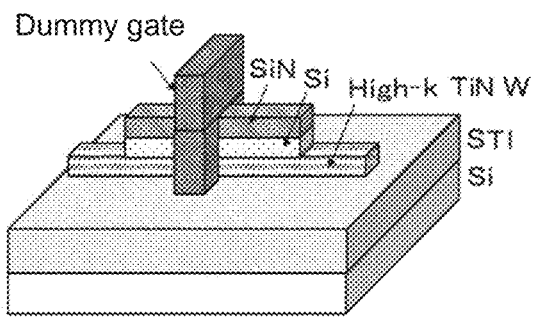
FIG. 2G is a diagram for describing the manufacturing method according to the first embodiment of the present invention.

Further, as shown in FIG. 2G, the SiN film and the Si film at both ends of the element region are etched and removed by RIE with a length of about 100 nm, and $HfO_2$ is removed by HF. Consequently, the quantum gate operation mechanism (TiN and W) overhangs at both ends of the element region.

Figure 2H:
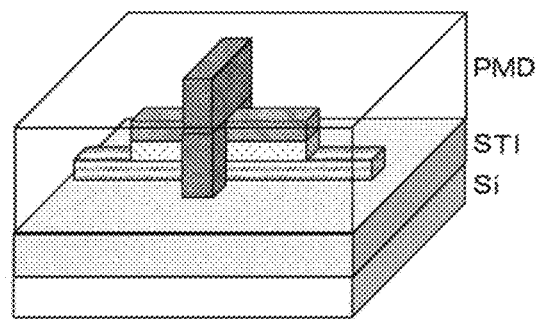
FIG. 2H is a diagram for describing the manufacturing method according to the first embodiment of the present invention.

In addition, as shown in FIG. 2H, a CVD-$SiO_2$ film is deposited 300 nm as PMD (Pre-Metal Dielectric-film) and flattened by CMP.

Figure 2I:
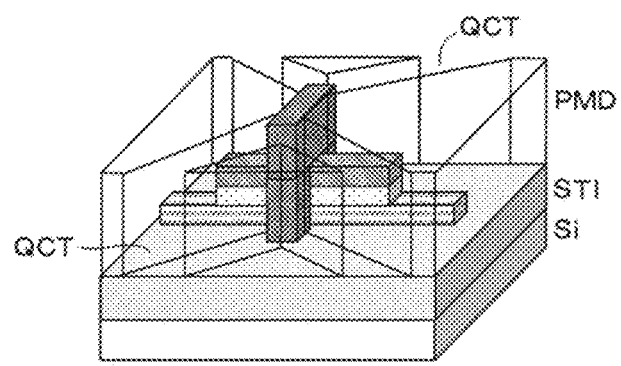
FIG. 2I is a diagram for describing the manufacturing method according to the first embodiment of the present invention.

After that, as shown in FIG. 2I, a trench (QCT: Qubits Connection Trench) for forming an inter-qubit coupler (wiring) is formed by lithography and RIE. Here, the trench QCT for forming the inter-qubit coupler forms a trench pattern so as to connect to the dummy gate so that the side surface of the dummy gate is exposed in the QCT. Incidentally, the dummy gate may be formed in the same shape as that of QCT in advance.

Figure 2J:
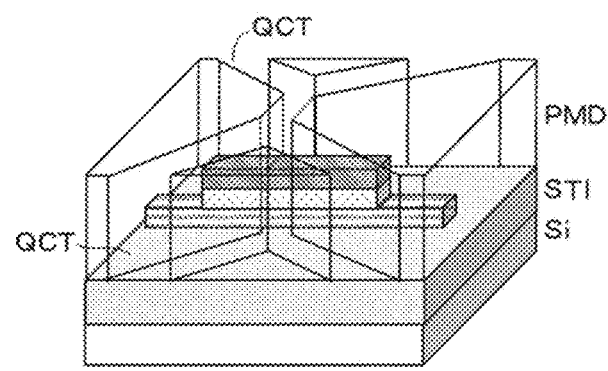
FIG. 2J is a diagram for describing the manufacturing method according to the first embodiment of the present invention.

Then, as shown in FIG. 2J, the dummy gate is removed by CDE (Chemical Dry Etching), and the oxide film of the Si side surface in the QCT is removed by the HF treatment, so that the side surface of the Si film in the element region is exposed in the QCT. However, the side surface of the Si film is exposed by adjusting a HF treatment time and the like, but the side surface of the metal material of the quantum gate operation mechanism is made to be covered with $HfO_2$ and is not exposed.

By doing so, the side surface of the Si film serving as the channel and the inter-qubit coupler come into direct contact with each other later. Therefore, it is possible to reduce variations in device characteristics and extend the life of the qubit.

Figure 2K:
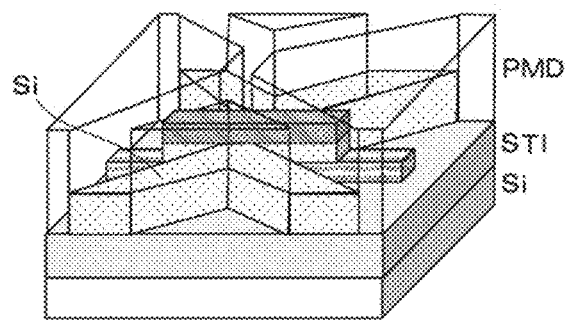
FIG. 2K is a diagram for describing the manufacturing method according to the first embodiment of the present invention.

Thereafter, as shown in FIG. 2K, polysilicon (Poly-Si) is deposited as the inter-qubit coupler (wiring), and the entire surface thereof is etched back to recess to near the same height as the surface of the Si film in the element region. Thus, a polysilicon wiring is formed at the bottom of the QCT. After that, SPE (Solid-Phase-Epitaxy. However, a metal-induced lateral crystallization (MILC) method or a laser annealing method may be used) is performed at about 650° C. to make polysilicon into a single crystal. In this way, the inter-qubit coupler is embedded and formed in self-alignment by QCT.

Since the inter-qubit coupler is formed by the Si single crystal in this way, the long-range spin coherence of the inter-qubit coupling that spin information is transmitted to an adjacent qubit without breaking is improved.

Figure 2L:
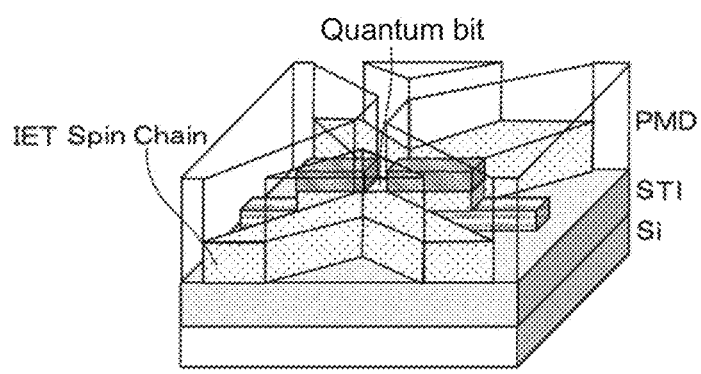
FIG. 2L is a diagram for describing the manufacturing method according to the first embodiment of the present invention.

Then, as shown in FIG. 2L, the hard mask (SiN film) of the region (the portion where the dummy gate has been formed and referred to as the channel region) corresponding to the channel in the element region is removed by RIE. For the formation of IET (Iso-Electronic Trap), for example, Al—N is ion-implanted into the channel region and the inter-qubit coupler (wiring). Implantation conditions for Al are, for example, Tilt=7 degrees, acceleration voltage=8 keV, concentration=$5\times10^{13}$ $cm^{-2}$, and implantation conditions for N are, for example, Tilt=7 degrees, acceleration voltage=10 keV, concentration=$5\times10^{13}$ $cm^{-2}$. IET stabilized annealing is performed at 450° C. for several hours. In this way, a qubit is formed in the channel region by IET. On the other hand, a spin chain (spin-chain. It is one which is in a state in which a plurality of electron spins are arranged in the horizontal direction and quantumly coupled to each other) is formed in the inter-qubit coupler.

Figure 2M:
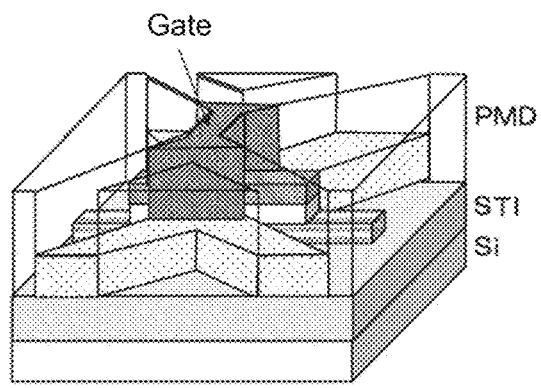
FIG. 2M is a diagram for describing the manufacturing method according to the first embodiment of the present invention.

Further, as shown in FIG. 2M, a High-k gate insulating film and a metal gate are formed by self-aligning on the region directly above the channel region and a part of the inter-qubit coupler (near both ends of the channel region) and formed at the upper part of the QCT. For example, 5 nm $HfO_2$ is deposited by ALD, and 5 nm TiN and 50 nm W (tungsten) are deposited by CVD and flattened by CMP, and the gate is patterned by lithography and RIE.

At this time, the pattern shape of the gate is wedge-shaped from both ends toward the center of the gate, as will be described again later with reference to FIG. 4. That is, both ends of the gate are wider in width than the center, and a gate pattern is formed in self-alignment by QCT on the region directly above the channel and the part of the inter-qubit coupler (near both ends of the channel). In other words, a gate electrode is formed in self-alignment with respect to the inter-qubit coupler so as to be wider in the direction of the inter-qubit coupler than the channel region.

Figure 2N:
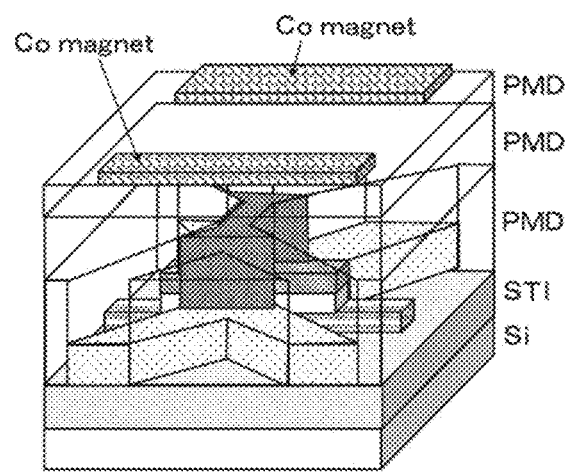
FIG. 2N is a diagram for describing the manufacturing method according to the first embodiment of the present invention.

Further, as shown in FIG. 2N, after depositing a PMD film having a thickness of 100 nm, cobalt magnets (Co-magnets) each having a thickness of about 20 nm are sputter-deposited and patterned by lithography and etching. As shown in FIG. 2N, the two cobalt magnets are arranged above the inter-qubit coupler with the top of the gate being open.

Figure 2O:
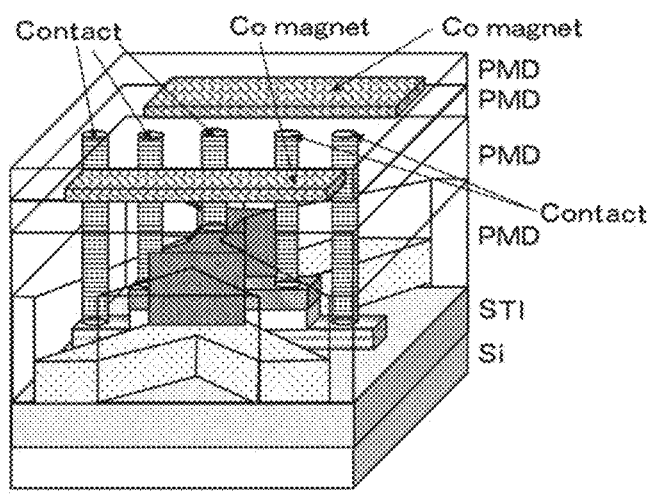
FIG. 2O is a diagram for describing the manufacturing method according to the first embodiment of the present invention.

After that, as shown in FIG. 2O, PMD-$SiO_2$ is deposited on the cobalt magnets at about 100 nm, and contact holes are further formed by lithography and RIE. Ti (5 nm)/TiN (2 nm)/W (300 nm) is deposited by CVD. Then, it is flattened by CMP.

After this, in a manner similar to the normal LSI (Large Scale Integrated circuit) formation, for example, Ti (20 nm)/TiN (30 nm)/Al (200 nm)/TiN (50 nm) wiring is formed by sputtering, lithography, and RIE, and an interlayer insulating film PSiO (100 nm, SiO grown by Plasma CVD)/USG (200 nm, Undoped Silicate Glass)/PSiN (500 nm, SiN grown by Plasma CVD) is deposited and formed, and sinter annealing at 400° C. or the like is performed thereon.

Figure 3:
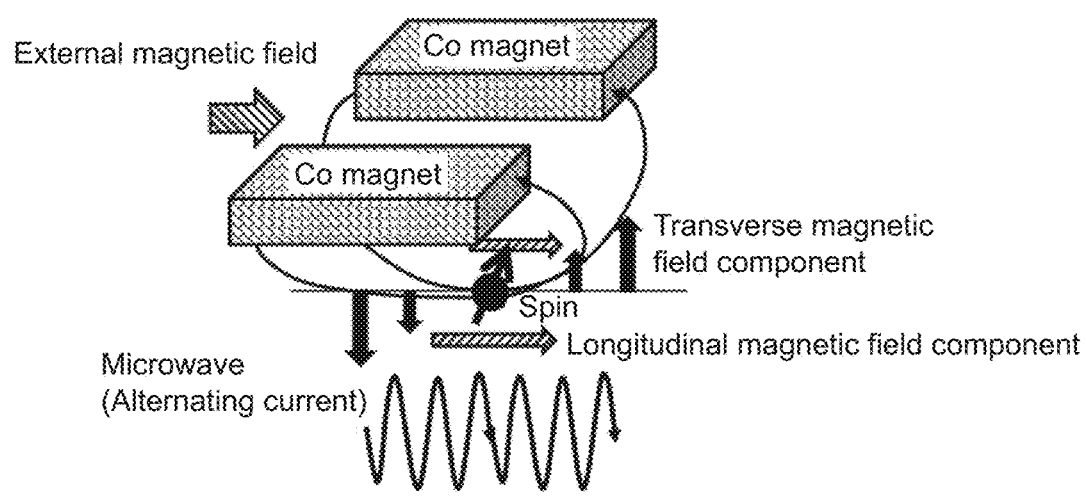
FIG. 3 is a diagram for describing the concept of spin quantum dot operation by a micro magnet.

The spin quantum dot operation by the micro magnet (cobalt magnet) in the device structure manufactured in this manner will be outlined with reference to FIG. 3. To explain in order, first, electrons vibrate left and right due to an AC voltage (microwave) applied to the quantum gate operation mechanism. Further, the electrons sense an alternating current magnetic field (transverse magnetic field) in the vertical direction. This is because the transverse magnetic field is unevenly distributed by the cobalt magnet. When the energy corresponding to the frequency of the microwave is equal to the Zeeman energy determined by the sum of an external magnetic field and a longitudinal magnetic field, electron spin resonance occurs and the spin rotates.

Thus, the channel, the inter-qubit coupler, the quantum gate operation mechanism, the source and drain (the readout mechanism), and the gate are all formed by self-aligning in the present embodiment. Consequently, it is possible to reduce variations in device characteristics. This also makes it possible to extend the life of the qubit. As a result, the silicon quantum bit device can be miniaturized, highly integrated, and reduced in cost.

Incidentally, the self-alignment brings about various contributions of the dummy gate. The channel is formed in self-alignment by covering the Si film with the dummy gate and removing the dummy gate. The inter-qubit coupler is also formed in self-alignment by the trench QCT formed by using the dummy gate. Even as for the quantum gate operation mechanism, the dummy gate sandwiches and supports the SiN film and the Si film, so that the SiGe film is removed and the quantum gate operation mechanism is embedded and formed in that portion by self-aligning. The gate is also formed in self-alignment by the trench QCT formed by using the dummy gate. Even as for the source and drain, in the underlying element region, the source, the channel region, and the source region are formed separately in self-alignment by the dummy gate.

Figure 4:
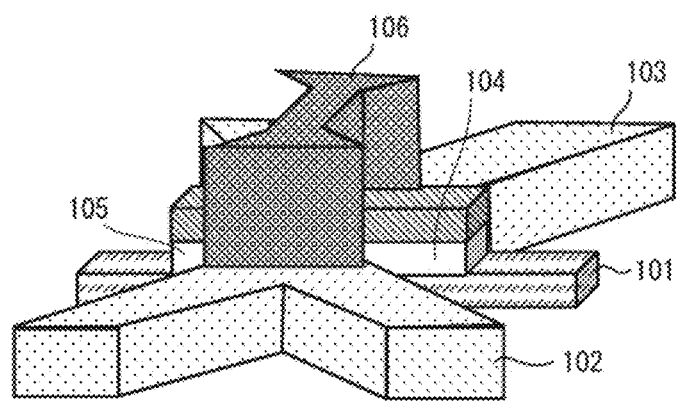
FIG. 4 is a diagram for describing a configuration in the first embodiment.

Only the main part of the silicon spin quantum bit device such as shown in FIG. 2O is shown again in FIG. 4. The silicon spin quantum bit device includes a quantum gate operation mechanism 101, inter-qubit couplers 102 and 103, and a tunnel field effect transistor including a source 104, a drain 105, a gate 106, and a channel (not shown in FIGS. 2O and 4).

The quantum gate operation mechanism 101 is formed linearly as $HfO_2$, TiN, and W wiring. The source 104 is linearly formed on the quantum gate operation mechanism 101 and on the right side of the gate 106 in FIG. 4. Further, the drain 105 is linearly formed on the quantum gate operation mechanism 101 and on the left side of the gate 106 in FIG. 4. The gate 106 is formed between the source 104 and the drain 105 on the Si channel above the quantum gate operation mechanism 101, but partly overhangs the inter-qubit couplers 102 and 103. Therefore, when viewed from above, the gate 106 has a wedge shape that tapers from the inter-qubit couplers 102 and 103 toward the center and widens toward the inter-qubit couplers 102 and 103. The channel is formed below the gate 106, and its side surface is in contact with the inter-qubit couplers 102 and 103.

Figure 5:
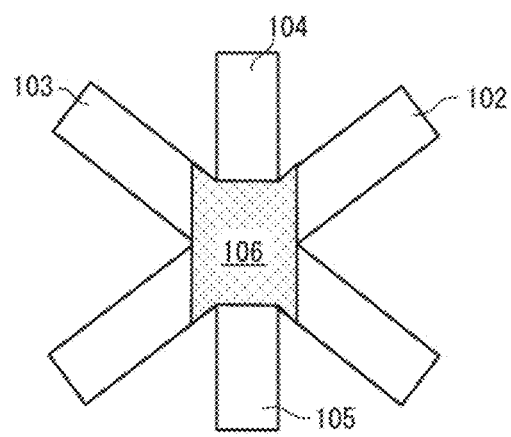
FIG. 5 is a diagram for describing the configuration and effects in the first embodiment.

The top view of FIG. 4 is shown in FIG. 5. The gate 106 is basically provided on the Si channel on the quantum gate operation mechanism 101 and between the source 104 and the drain 105, but has portions wider in width than the source 104 and the drain 105. That is, the gate 106 is formed so as to partially overlap with the inter-qubit couplers 102 and 103. Further, since the gate 106 is formed in self-alignment by QCT, the portions protruding toward the inter-qubit couplers 102 and 103 have the same shape as the inter-qubit couplers 102 and 103. Such a shape of the gate 106 can prevent a leakage current between the source and the drain and a leakage current to the inter-qubit couplers 102 and 103.

Second Embodiment

Figure 6:
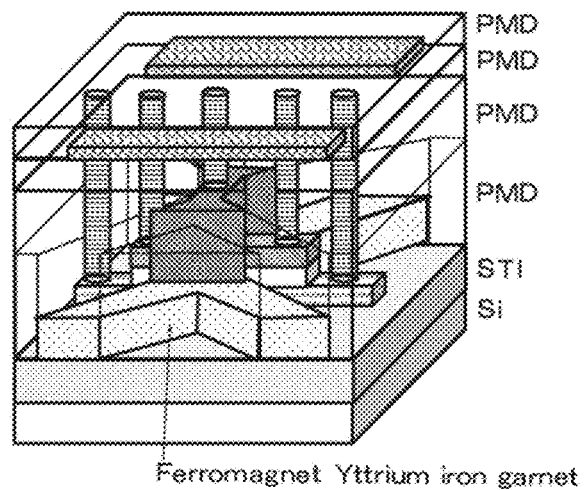
FIG. 6 is a diagram for describing a configuration in a second embodiment.

FIG. 6 shows a configuration example of a spin quantum bit device according to a second embodiment. A device structure is almost the same as that of the first embodiment, but a ferromagnet is used for an inter-qubit coupler. A ferromagnetic material is, for example, a magnetic insulator of Yttrium-Iron Garnet (YIG: Yttrium Iron Garnet). Magnetic dipole-dipole interaction enables coupling between a plurality of qubits and ferromagnets.

A manufacturing method is also the same as that of the first embodiment, but there is known an organometallic decomposition method as an example of a YIG thin film deposition method. A solution containing a metallic organic compound as a main component is applied and annealed at a high temperature. However, it is performed before channel IET formation.

As another material example, a magnonic crystal is also a material which couples between spins. That is, permalloy (FeNi, metal magnetic substance), a Heusler alloy, or the like may be used.

Third Embodiment

Figure 7:
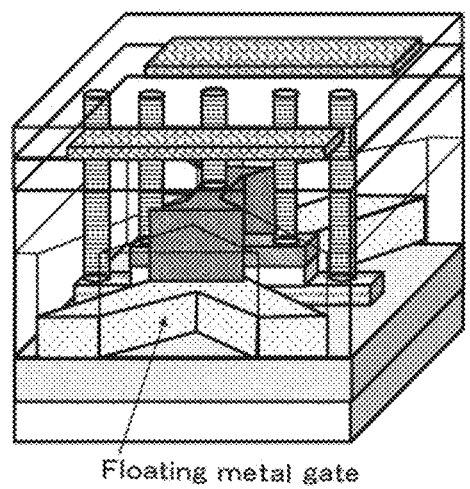
FIG. 7 is a diagram for describing a configuration in a third embodiment.

FIG. 7 shows a configuration example of a spin quantum bit device according to a third embodiment. A device structure is almost the same as that of the first embodiment, but a floating metal gate via a gate insulating film is used for an inter-qubit coupler. This can capacitively couple between qubits.

A manufacturing method is also almost the same as that of the first embodiment, but a 5 nm $HfO_2$ gate insulating film, TiN and a W metal are deposited in a trench QCT for forming the inter-qubit coupler and flattened by CMP. After that, recessing is performed by etchback and RIE, and thereby the height is adjusted.

Fourth Embodiment

Figure 8:
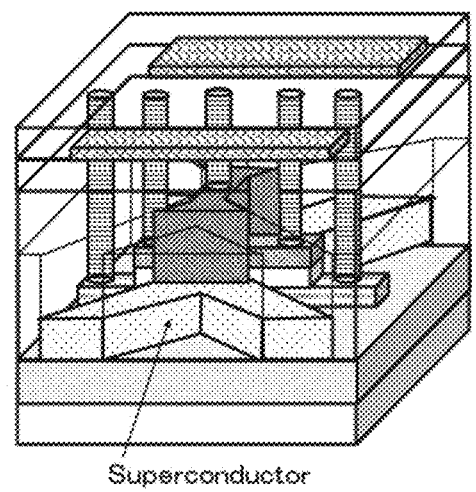
FIG. 8 is a diagram for describing a configuration in a fourth embodiment.

FIG. 8 shows a configuration example of a spin quantum bit device according to a fourth embodiment. A device structure is almost the same as that of the first embodiment, but a superconductive material is used for an inter-qubit coupler. The superconductive material is, for example, a simple substance such as Nb, Nb—Ti, Nb—Al, or a laminated film of them and a semiconductor (Si, InSb, InAs, etc.).

As a manufacturing method, these materials are deposited by sputtering, vapor deposition, CVD, etc., etched back by ion milling, dry etching, etc., and embedded in a trench.

Although the embodiments of the present invention have been described above, the embodiments described above can be variously modified in a form along the gist thereof. For example, the SiGe film is a temporarily formed film which is removed to form a quantum gate operation mechanism later and may be formed of other suitable material (for example, Ge).

Figure 1A:
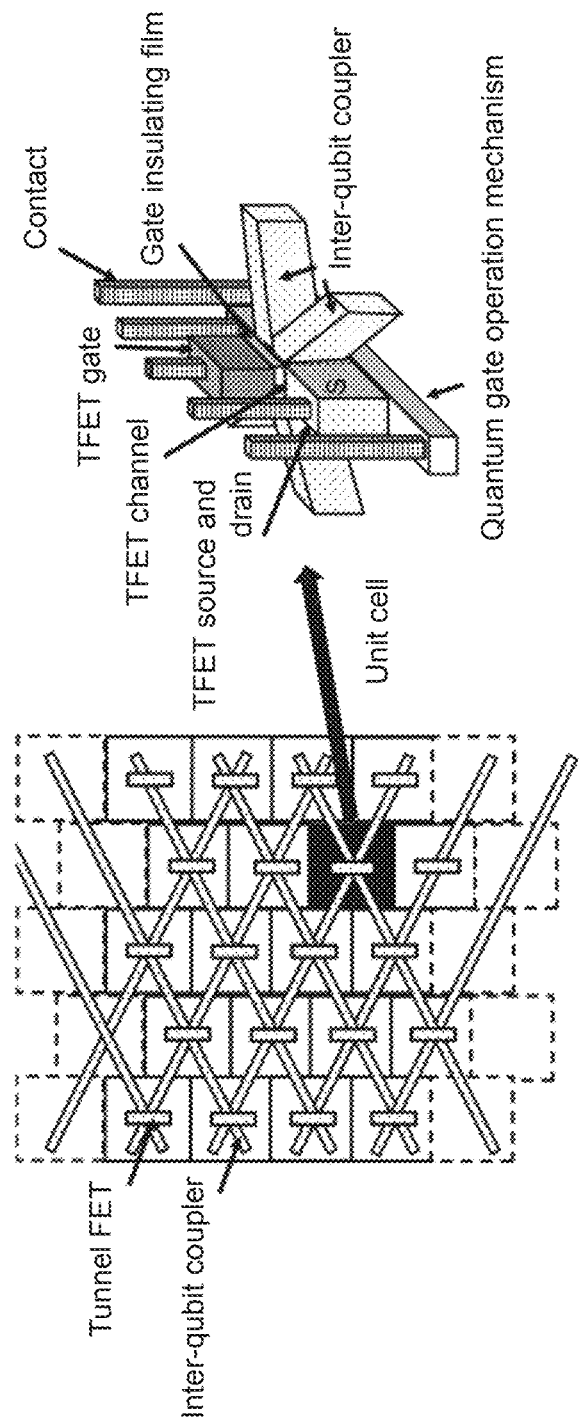
FIG. 1A is a diagram for describing a problem of the prior art.
Figure 1B:
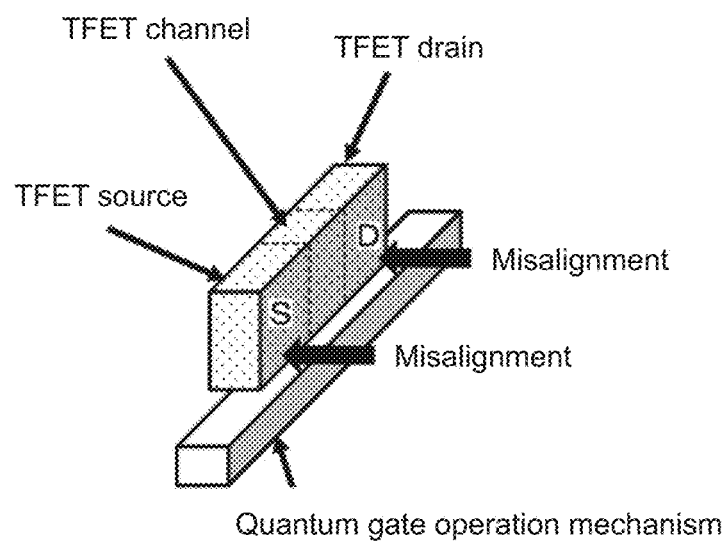
FIG. 1B is a diagram for describing a problem of the prior art.
Figure 1C:
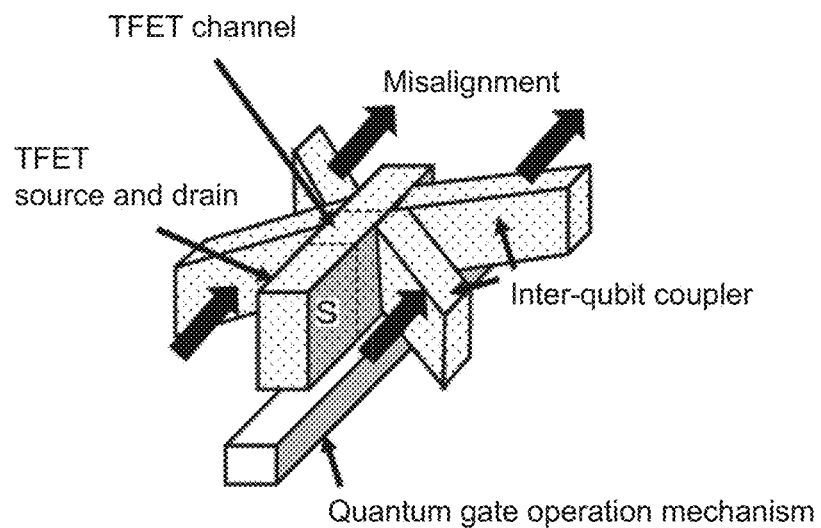
FIG. 1C is a diagram for describing a problem of the prior art.
Figure 1D:
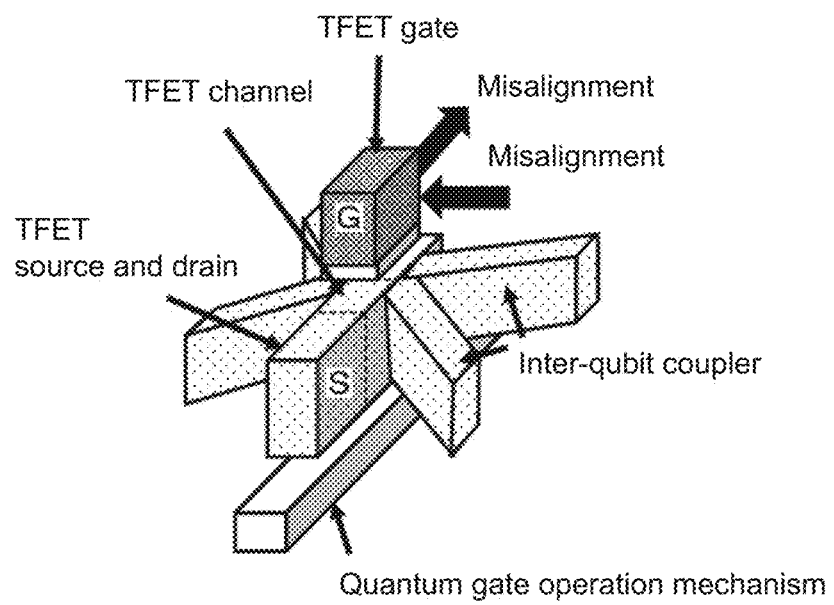
FIG. 1D is a diagram for describing a problem of the prior art.
Figure 1E:
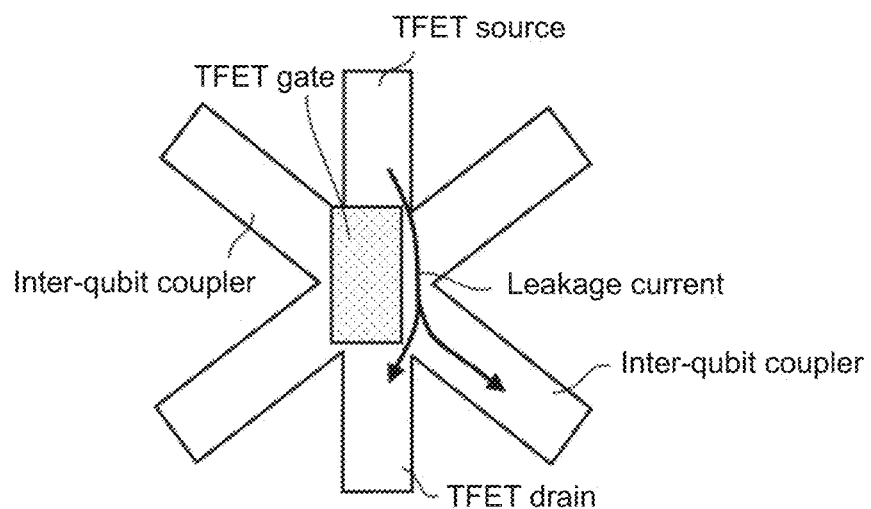
FIG. 1E is a diagram for describing a problem of the prior art.
Figure 1F:
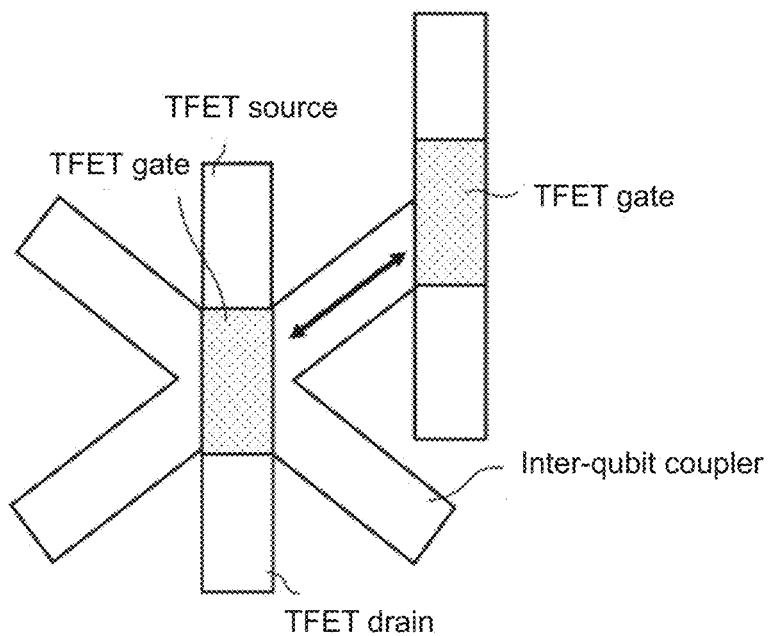
FIG. 1F is a diagram for describing a problem of the prior art.

Further, in order to suppress the variations in device characteristics, it is preferable to eliminate all the misalignments shown in FIGS. 1B to 1D, but only a part thereof may be dealt with by the method described in the above embodiment in accordance with the relationship with other requirements and the like. In addition, the above is merely an example of a typical material. If a more preferable material exists, it may be used. Furthermore, when the same effect can be obtained, each step may be realized by adopting a method different from the method described above.

The embodiments described above can be summarized as follows.

The manufacturing method according to the present embodiment is a manufacturing method of a silicon spin quantum bit device having a tunnel field effect transistor, an inter-qubit coupler, and a quantum gate operation mechanism. A dummy gate is formed so as to cover a portion where a channel region of the tunnel field effect transistor is formed in a silicon film and a portion in contact with the inter-qubit coupler. Using the dummy gate, at least either of the inter-qubit coupler and the quantum gate operation mechanism is formed in self-alignment for at least a part of the tunnel field effect transistor.

By forming the dummy gate in this way, it is possible to reduce the misalignment of the components and suppress variations in device characteristics. Consequently, the silicon spin quantum bit device can be miniaturized, highly integrated, and reduced in cost, and hence the life of the qubit can be extended. Incidentally, for example, the inter-qubit coupler is formed in self-alignment with respect to the channel region of the tunnel field effect transistor, and the quantum gate operation mechanism is formed in self-alignment with respect to the entire tunnel field effect transistor. Further, the inter-qubit coupler can be formed without depending on the formation method of the quantum gate operation mechanism.

Further, the dummy gate may be formed so as to sandwich and support the temporarily formed film temporarily formed on the silicon substrate and under the silicon film and the part of the side surface of the silicon film. In this case, after forming the dummy gate, the temporarily formed film may be removed to form a hollow portion under the silicon film, and the quantum gate operation mechanism may be embedded and formed in the hollow portion.

By doing so, it is possible to suppress misalignment of the quantum gate operation mechanism and suppress variations in device characteristics. In particular, since the distance between the channel and the quantum gate operation mechanism can be shortened, the quantum gate operation efficiency can be improved and crosstalk can be prevented.

Further, a trench for forming the inter-qubit coupler may be formed on the basis of the dummy gate, and the inter-qubit coupler may be formed by using the trench. Consequently, it is possible to suppress the misalignment of the inter-qubit coupler and suppress the variations in device characteristics.

Incidentally, when the planar layout shape of the dummy gate is a part of the planar layout shape of the trench, it may be such that a trench portion other than the dummy gate is formed, the dummy gate is removed, and the trench including the trench portion is formed. On the other hand, when the planar layout shape of the dummy gate and the planar layout shape of the trench are the same, the trench may be formed by removing the dummy gate. Although the shape of the dummy gate is arbitrary, it also greatly contributes to the formation of the inter-qubit coupler through the trench formation.

Further, polysilicon is embedded in the trench so as to be in contact with the channel region and single crystallized. Ion implantation for IET (Iso-Electronic Trap) formation may be performed with respect to the channel region and the single crystal silicon in the trench. Since a single crystal wiring including a spin chain is formed, the long-range spin coherence of the inter-qubit coupling is improved. That is, spin information is transmitted to the next device without being destroyed.

Further, using the trench, the gate of the tunnel field effect transistor may be formed on the channel region, and made wider in width than the channel region and partly formed on the inter-qubit coupler. It becomes possible to suppress a leakage current between the source and drain, etc.

The silicon spin quantum bit device according to the present embodiment has (A) a tunnel field effect transistor having a gate, a source, and a drain, (B) a quantum gate operation mechanism for spin control provided under the tunnel field effect transistor, and (C) an inter-qubit coupler for coupling the channel of the tunnel field effect transistor with the channel of the tunnel field effect transistor included in another quantum bit device. Then, the gate is wider in width than the channel and partly formed on the inter-qubit coupler.

This makes it possible to suppress the leakage current between the source and drain and the leakage current to the inter-qubit coupler. Incidentally, the inter-qubit coupler may be configured to be in contact with the side surface of the channel.

Incidentally, the inter-qubit coupler described above may be made of single crystal silicon containing the spin chain. This will improve the long-range spin coherence of inter-qubit coupling. Incidentally, if the channel and the inter-qubit coupler are formed by being subjected to ion implantation for IET formation, it becomes easier to couple the qubits to each other and realize qubit-to-qubit entanglement.

Further, the inter-qubit coupler described above may be comprised of a ferromagnet, a floating metal gate, or a superconductor. Even in such a configuration, the long-range spin coherence of the inter-qubit coupling is improved.

Incidentally, such a silicon spin quantum bit device can be applied to silicon quantum computers in general. For example, it can be applied to a quantum computer server, a quantum computer cloud service, a quantum communication device, a quantum encryption processing device, and the like.

The invention claimed is:

1. A manufacturing method of a silicon spin quantum bit device having a tunnel field effect transistor, an inter-qubit coupler, and a quantum gate operation mechanism, comprising the steps of:
   forming a dummy gate in a silicon film so as to cover a portion in which a channel region of the tunnel field effect transistor is formed and a portion in contact with the inter-qubit coupler; and
   forming in self-alignment at least either of the inter-qubit coupler and the quantum gate operation mechanism with respect to at least a part of the tunnel field effect transistor by using the dummy gate.

2. The manufacturing method according to claim 1, wherein a trench for forming the inter-qubit coupler is formed on the basis of the dummy gate, and the inter-qubit coupler is formed by using the trench.

3. The manufacturing method according to claim 2, wherein when a planar layout of the dummy gate is a part of a planar layout of the trench, a trench portion other than the dummy gate is formed, and the dummy gate is removed to form the trench including the trench portion, and
   wherein when a planar layout shape of the dummy gate and a planar layout shape of the trench are the same, the dummy gate is removed to form the trench.

4. The manufacturing method according to claim 2, wherein polysilicon is embedded in the trench so as to be in contact with the channel region and the polysilicon is single crystallized, and wherein ion implantation for IET (Iso-Electronic Trap) formation is performed on the channel region and a single crystal silicon.

5. The manufacturing method according to claim 2, wherein using the trench, a gate of the tunnel field effect transistor is formed on the channel region, and is made wider in width than the channel region and partly on the inter-qubit coupler.

6. The manufacturing method according to claim 1, wherein the dummy gate is formed so as to sandwich and support a temporarily formed film temporarily formed on a silicon substrate and under the silicon film and a part of a side surface of the silicon film, and wherein after forming the dummy gate, the temporarily formed film is removed to form a hollow portion under the silicon film, and the quantum gate operation mechanism is embedded and formed in the hollow portion.

7. A silicon spin quantum bit device comprising:

a tunnel field effect transistor having a gate, a source, and a drain;

a quantum gate operation mechanism for spin control, which is provided under the tunnel field effect transistor; and an inter-qubit coupler for coupling a channel of the tunnel field effect transistor with a channel of a tunnel field effect transistor included in another quantum bit device, wherein the gate is made wider in width than the channel and partly on the inter-qubit coupler.

8. The silicon spin quantum bit device according to claim 7, wherein the inter-qubit coupler is comprised of single crystal silicon containing a spin chain.

9. The silicon spin quantum bit device according to claim 7, wherein the inter-qubit coupler is comprised of a ferromagnet, a floating metal gate, or a superconductor.

* * * * *